United States Patent
Renz et al.

(10) Patent No.: US 9,989,603 B2
(45) Date of Patent: Jun. 5, 2018

(54) METHOD AND APPARATUS FOR LOCAL SPECIFIC ABSORPTION RATE REDUCTION

(71) Applicants: Wolfgang Renz, Erlangen (DE); Markus Vester, Nürnberg (DE)

(72) Inventors: Wolfgang Renz, Erlangen (DE); Markus Vester, Nürnberg (DE)

(73) Assignee: Siemens Aktiengesellschaft, München (DE)

( * ) Notice: Subject to any disclaimer, the term of this patent is extended or adjusted under 35 U.S.C. 154(b) by 632 days.

(21) Appl. No.: 14/468,937

(22) Filed: Aug. 26, 2014

(65) Prior Publication Data

US 2015/0061681 A1    Mar. 5, 2015

(30) Foreign Application Priority Data

Aug. 27, 2013   (DE) .................. 10 2013 217 012

(51) Int. Cl.
  *G01R 33/36* (2006.01)
  *G01R 33/28* (2006.01)

(52) U.S. Cl.
  CPC ......... *G01R 33/36* (2013.01); *G01R 33/3607* (2013.01); *G01R 33/3635* (2013.01); *G01R 33/288* (2013.01); *G01R 33/3678* (2013.01)

(58) Field of Classification Search
  CPC .............. G01R 33/36; G01R 33/3607; G01R 33/3635; G01R 33/288; G01R 33/3678
  See application file for complete search history.

(56) References Cited

U.S. PATENT DOCUMENTS

| 5,179,332 A * | 1/1993 | Kang ................ G01R 33/3607 324/307 |
| 2005/0127914 A1 | 6/2005 | Eberler et al. |
| 2008/0227416 A1 | 9/2008 | Nistler et al. |
| 2008/0284432 A1 * | 11/2008 | Nistler ............... G01R 33/3415 324/307 |
| 2009/0189609 A1 * | 7/2009 | Eberler ........... G01R 33/34076 324/322 |
| 2012/0098540 A1 * | 4/2012 | Biber ................ G01R 33/3621 324/318 |

FOREIGN PATENT DOCUMENTS

| DE | 10314215 B4 | 11/2006 |
| DE | 102007012052 | 9/2008 |
| DE | 102008005994 | 8/2009 |

OTHER PUBLICATIONS

German Office Action cited in DE102013217012.2, dated Feb. 25, 2014.
Power Dividers and Directional Couplers, Jul. 15, 2014, Wikipedia.com.

* cited by examiner

*Primary Examiner* — David M Gray
*Assistant Examiner* — Laura Roth
(74) *Attorney, Agent, or Firm* — Lempia Summerfield Katz LLC

(57) ABSTRACT

The embodiments relate to a method, an MRI device, and a circuit for a magnetic resonance imaging device that includes at least one transmission coil for transmitting a magnetic field. The circuit includes a hybrid coupler and at least one phase shifter arranged in the transmission path between an amplifier and at least one transmission coil of the magnetic resonance imaging device.

16 Claims, 2 Drawing Sheets

METHOD AND APPARATUS FOR LOCAL SPECIFIC ABSORPTION RATE REDUCTION

CROSS-REFERENCE TO RELATED APPLICATIONS

This application claims the benefit of DE 10 2013 217 012.2, filed on Aug. 27, 2013, which is hereby incorporated by reference in its entirety.

TECHNICAL FIELD

The embodiments relate to devices and methods for magnetic resonance imaging.

BACKGROUND

Magnetic resonance imaging devices (also referred to as MRI or MR devices) for examining objects or patients by magnetic resonance imaging are known from, e.g., DE 103 14 215 B4.

SUMMARY

It is an object of the embodiments to optimize devices and methods for magnetic resonance imaging.

The scope of the present invention is defined solely by the appended claims and is not affected to any degree by the statements within this summary. The present embodiments may obviate one or more of the drawbacks or limitations in the related art.

DETAILED DESCRIPTION

Figure 2:
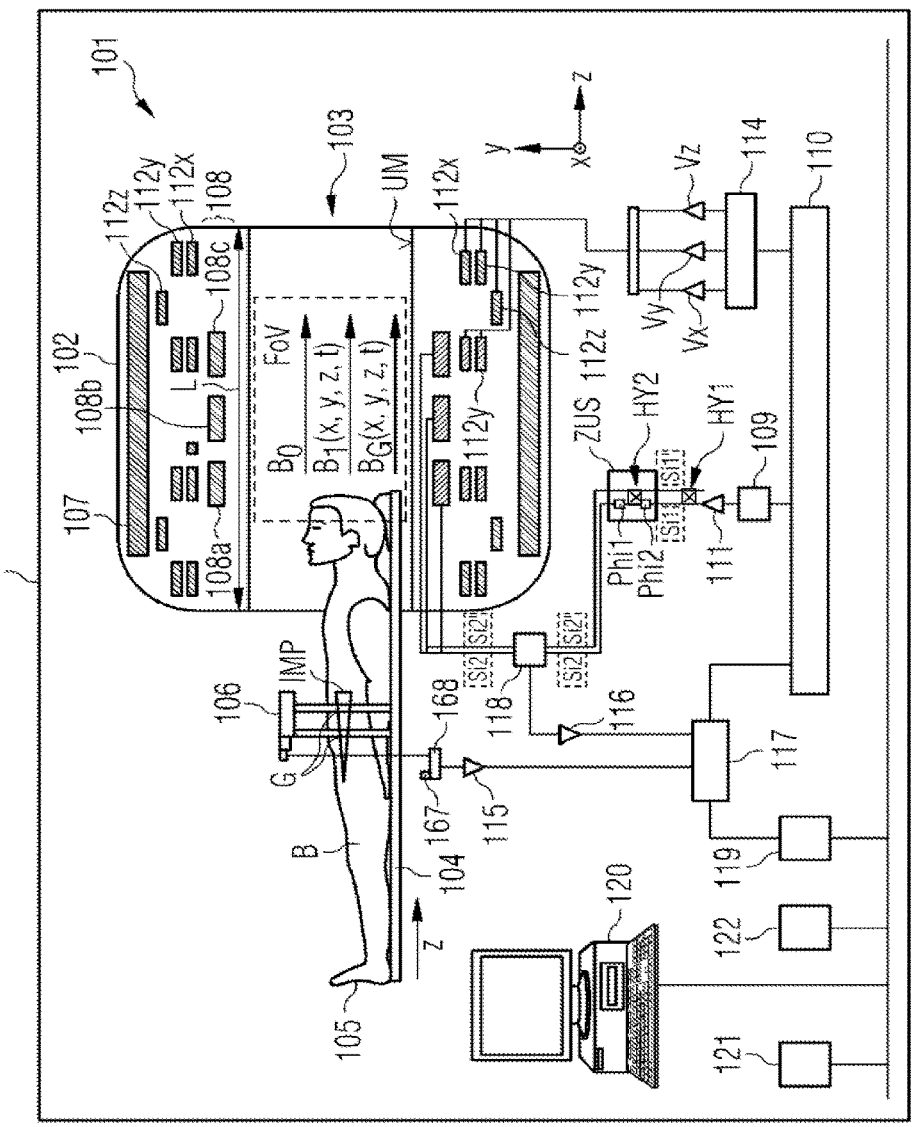
FIG. 2 schematically depicts an embodiment of a MRI system.

FIG. 2 depicts a magnetic resonance imaging device MRI 101 (situated in a shielded room or Faraday cage F) with a whole body coil 102. The MRI device includes a tubular space 103 into which a patient couch 104 with a body of, e.g., an examination object 105 (e.g., of a patient) (with or without local coil arrangement 106) may be driven in the direction of the arrow z in order to generate recordings of the patient 105 by an imaging method. In this case, a local coil arrangement 106 is arranged on the patient in a local region (also referred to as field of view or FOV) of the MRI, by which recordings of a portion of the body 105 in the FOV may be generated. Signals of the local coil arrangement 106 may be evaluated (e.g., converted into images, stored, or displayed) by an evaluation device (168, 115, 117, 119, 120, 121, etc.) of the MRI 101. The evaluation device may be connected to the local coil arrangement 106 by, for example, coaxial cables, a radio link (167), etc.

In order to use a magnetic resonance imaging device MRI 101 to examine a body 105 (an examination object or a patient) by magnetic resonance imaging, different magnetic fields, which are precisely matched to one another in terms of their temporal and spatial characteristics, are radiated onto the body 105. A strong magnet (e.g., a cryomagnet 107) in a measurement cabin with an opening 103, which may be tunnel-shaped, generates a strong static main magnetic field $B_0$. The magnetic field $B_0$ may have a strength of 0.2 Tesla to 3 Tesla, or more. A body 105 to be examined (with, e.g., a hip-joint implant IMP in the leg B) is, while supported by a patient couch 104, driven into a region of the main magnetic field $B_0$. The region of the magnetic field $B_0$ is approximately homogeneous in the observation region field of view (FoV). The nuclear spins of atomic nuclei of the body 105 are excited by magnetic radiofrequency excitation pulses (also referred to as $B_1$ magnetic field) $B_1$ (x, y, z, t). The excitation pulses are radiated in by a radiofrequency antenna (and/or, optionally, a local coil arrangement) depicted here in a simplified manner as (e.g., multipart=108a, 108b, 108c) body coil 108. By way of example, radiofrequency excitation pulses are generated by a pulse generation unit 109, which is controlled by a pulse sequence control unit 110. After amplification by a radiofrequency amplifier 111, the excitation pulses are conducted on in the transmission path 109, 11, HY1, Phi1, HY2, Phi2, 118, 108a-c/106 (via one or more lines) to the radiofrequency antenna 108 (with optionally mutually independently actuatable elements 108a, 108b, . . . ). The radiofrequency system depicted here is merely indicated schematically. In a magnetic resonance imaging device 101, use is often made of more than one pulse generation unit 109, more than one radiofrequency amplifier 111, and several radiofrequency antennas 108a, b, c.

The magnetic resonance imaging device 101 furthermore includes gradient coils 112x, 112y, 112z, by which magnetic gradient fields $B_G$ (x, y, z, t) are radiated in during a measurement for selective slice excitation and for spatial encoding of the measurement signal. The gradient coils 112x, 112y, 112z are controlled by a gradient coil control unit 114 and, optionally, amplifiers Vx, Vy, Vz. The control unit 114, like the pulse generation unit 109, is connected to the pulse sequence control unit 110.

Signals emitted by the excited nuclear spins (e.g., of the atomic nuclei in the examination object) are received by the body coil 108 and/or at least one local coil arrangement 106. The signals are amplified by associated radiofrequency preamplifiers 116 and processed further and digitized by a reception unit 117. The recorded measurement data are digitized and stored as complex numbers in a k-space matrix. An associated MR image may be reconstructed from the k-space matrix filled with values by a multidimensional Fourier transform.

For a coil that may be operated both in transmission mode and in reception mode, such as, e.g., the body coil 108 or a local coil 106, the correct signal transmission is regulated by an upstream transmission/reception switch 118.

An image processing unit 119 generates an image from the measurement data that is displayed to a user by an operating console 120 and/or stored in a storage unit 121. A central computer unit 122 controls the individual installation components.

In MR imaging, images with a high signal-to-noise ratio (SNR) may be recorded these days using so-called local coil arrangements (e.g., coils, local coils). The local coil arrangements are antenna systems that are attached in the direct vicinity on (e.g., anterior), under (e.g., posterior), at the body 105, or in the body 105. During a MR measurement, the excited nuclei induce a voltage in the individual antennas of the local coil, which is then amplified using a low-noise preamplifier (e.g. LNA, preamp) and finally transmitted to the reception electronics. In order to improve the signal-to-noise ratio even in the case of high resolution images, use is made of so-called high-field installations (e.g., 1.5 T-12 T or more). If more individual antennas may be connected to a MR reception system than receivers available, a switching matrix (also referred to as RCCS), for example, is installed between reception antennas and receivers. The matrix routes the currently active reception channels (e.g., those that currently lie in the field of view of the magnet) to the available receivers. As a result, it is possible to connect more coil elements than receivers available because, in the case of a whole body cover, it is only necessary to read coils that are situated in the FoV or in the homogeneous volume of the magnet.

By way of example, an antenna system, which may include one antenna element or, as an array coil, of several antenna elements (e.g., coil elements), may be referred to as local coil arrangement 106. By way of example, these individual antenna elements are embodied as loop antennas (e.g., loops), butterfly coils, flex coils, or saddle coils. By way of example, a local coil arrangement includes coil elements, a preamplifier, further electronics (e.g., standing wave traps, etc.), a housing, supports, and, optionally, a cable with plug by which the local coil arrangement is connected to the MRI installation. A receiver 168 attached to the installation side filters and digitizes a signal received from a local coil 106, (e.g., by radio link, etc.), and transmits the data to a digital signal processing device. The processing device may derive an image or spectrum from the data obtained by the measurement and make the image or spectrum available to the user, e.g., for the subsequent diagnosis by the user and/or for storing.

Until now, MRI examinations have not been very well suited to patients 105 with, e.g., extensive metallic implants IMP since there is a risk of excessive specific absorption rates (SARs) as a result of the irradiating RF fields even when non-magnetic materials are used. For this, the E-fields, which are also generated in MRI equipment in addition to the MR-effective $B_1$-field, may be decisive.

Examinations may be permitted, in which, as a result of local transmission coils 106 and/or of positioning of the implant region IMP as far away from the transmission coil 106, 108 as possible, the local excessive SAR is minimized. Furthermore, it is possible to generate E-field distributions in the body of the patient that cause a reduction in local SAR peaks on implants IMP as a result of $B_1$ transmission field distributions, which deviate from the CP excitation that is ideal for MRIs. Although this increases the global SAR values, this results in an improvement overall in the obtainable performance since the local SAR values are the most strongly limiting aspect.

The transmission field distributions deviating from an ideal CP excitation have previously been generated by two-channel or multi-channel transmission systems with mutually independently actuatable transmitters for the sub-signals. These are technically complex, and hence expensive and previously only contained in high-field systems, in which they are used (e.g., for homogenizing the $B_1$-field). From a SAR point of view, high field systems are significantly less expedient than standard 1.5 T systems (e.g., SAR~$B_0^2$) and hence rather unsuitable for applications that are strongly SAR restricted. Standard MRI systems (e.g., with 1.5 T), which are more expedient from a SAR point of view, may not include multi-channel transmission devices.

Figure 1:
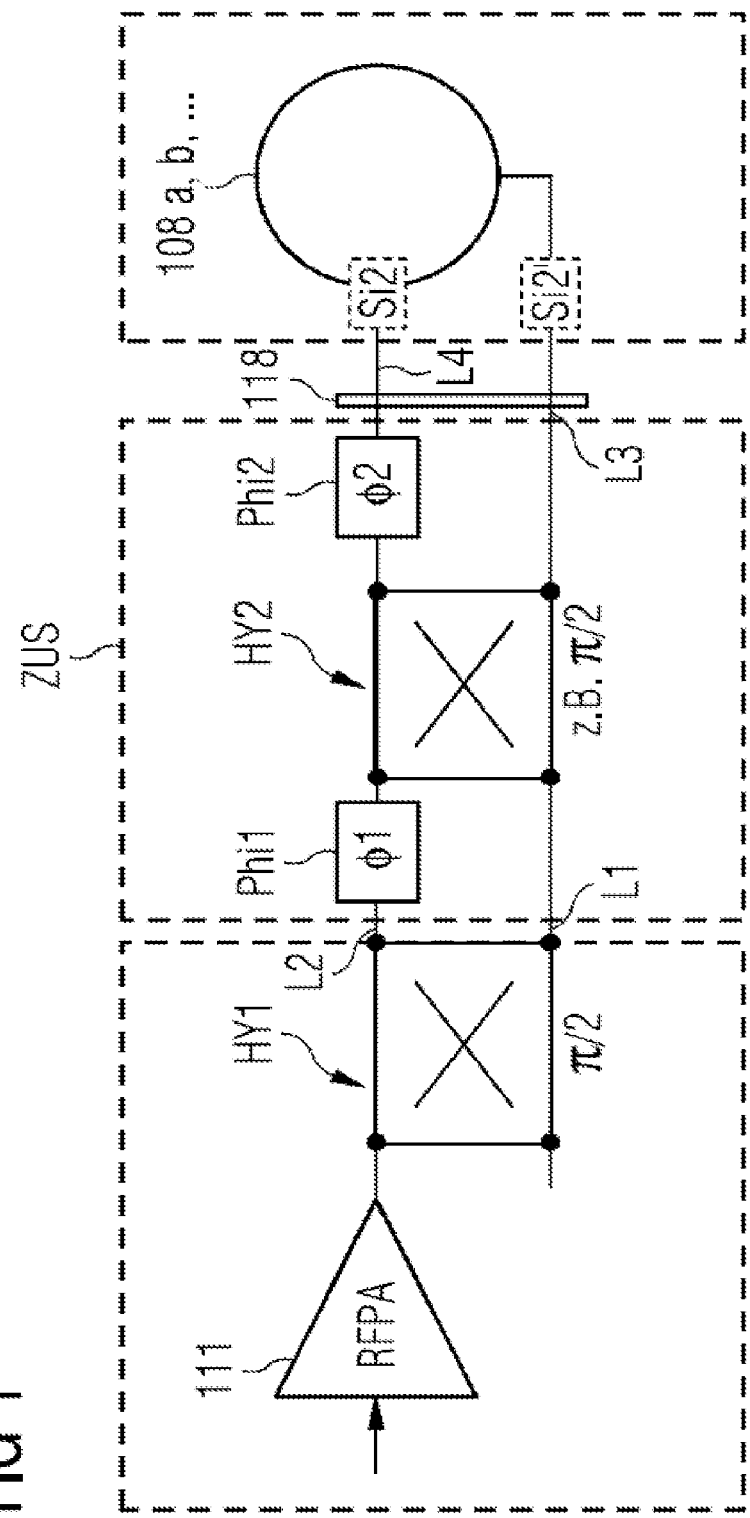
FIG. 1 depicts parts of an embodiment of a MRI transmission system in a schematic and simplified manner.

As depicted in the schematic of FIG. 1, an embodiment with an (additional) circuit ZUS in the transmission path (ZUS; 109, 111, HY1, HY2, Phi1, Phi2, 118, 108) to the body coil 108 and/or to the local coil 106 is proposed.

As a result of, in particular, an additional hybrid HY2 and two phase shifters Phi1, Phi2, it is possible to convert the generated $B_1$-fields ($B_1$ (x, y, z, t)) generated (e.g., by signals Si2, Si2' by a body coil antenna 108) as desired from circularly polarized to elliptically polarized and on to linearly polarized. It is also possible to rotate as desired the phase of the elliptical or linear polarization of the $B_1$-fields ($B_1$ (x, y, z, t)) generated (by the signals SI2, SI2' by a body coil 108). Hence, it is possible to emulate (e.g., completely) the adjustment options in this respect of a real 2-channel system.

By way of example, "hybrid" is also a designation for "hybrid coupler," in particular for RF applications and, for example, explained in an exemplary manner in http://en.wikipedia.org/wiki/Power_dividers_and_directional_couplers.

Both hybrid circuits HY1, HY2 may be, e.g., 90° hybrids and/or pi/2 hybrids. The hybrid circuits HY1, HY2 may also be used in a conventional manner for generating a circular polarization in a MRI device. However, since the phase shifters Phi1, Phi2 may be freely adjustable, it is also possible to use other hybrids HY2 with the same power division (e.g., with respect to one another) and nevertheless a different phase (e.g., also pi hybrids).

The (additional) circuit ZUS is arranged, e.g., between an arrangement 111 with an (e.g., RFPA) amplifier and, in this case, a hybrid circuit HY1 on the one side and a body coil 108 on the other side. In one embodiment, the circuit ZUS is between an arrangement 111 with an (e.g., RFPA) amplifier and a switch 118. The hybrid circuit HY1 may be, e.g., a power divider and divide the power from signals downstream of the amplifier, e.g., between the depicted upper and lower lines L1, L2 with a phase shift of pi/2 with respect to one another. By way of example, the hybrid circuit HY2 may divide, e.g., the power of signals S1, S1' in the lines L1 and/or L2 downstream of the hybrid circuit HY1 between signals Si2, SI2' in the depicted upper and lower lines L3, L4 with, e.g., a pi/2 shift with respect to one another (e.g., with a phase setting depending on the actuatable phase shifters Phi1, Phi2 (actuatable by 109) and/or a phase shift in the hybrid circuit HY2 by, e.g., 90 degrees).

Of the two phase shifters Phi1, Phi2 in the circuit ZUS, both are arranged at the top of the image (e.g., between L2 and L4). In certain embodiments, a phase shifter may, for example, also be arranged upstream of the lower line L3, etc. Signals Si2, SI2' in the depicted lines L3, L4 may, e.g., be guided to two or more antenna elements (e.g., in a ring (segment) form and/or rod form) or to groups of antenna elements 108a, 108b, 108c of a body coil 108 in order in each case to generate $B_1$-field components for a $B_1$-field $B_1$ (x, y, z, t) to be generated.

The phases of the signals and/or $B_1$-field (components) to be adjusted with the phase shifters Phi1, Phi2 may e.g. be calculated directly from the desired parameters of a desired polarization ellipse:

First, the amplitude ratio of the two sub-antennas (e.g., antenna groups) is adjusted by the phase shifter Phi1; subsequently, the phase between these is adjusted by the phase shifter Phi2.

The (additional) circuit ZUS for freely adjusting the polarization may also be retrospectively installed into an existing circularly polarizing MRI system 101, e.g., where it is depicted in a slightly simplified manner in FIG. 2.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

While the present invention has been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A circuit for a magnetic resonance imaging device having at least one transmission coil for transmitting a magnetic field, the circuit comprising:
   at least two hybrid couplers in a transmission path between an amplifier and the at least one transmission coil; and
   at least two phase shifters configured to be arranged in the transmission path between the amplifier and the at least one transmission coil of the magnetic resonance imaging device,
   wherein the circuit is configured to emulate adjustment options of a two-channel system.

2. The circuit as claimed in claim 1, wherein the at least two phase shifters are configured to shift phases of signals that leave the phase shifters with respect to one another, shift the phases of the signals that leave the at least two phase shifters with respect to phases of input signals of the at least two phase shifters, or a combination thereof.

3. The circuit as claimed in claim 2, wherein the circuit is configured to convert first signals for generating B1-fields into second signals for generating B1-fields comprising a circularly polarized form, elliptically polarized form, linearly polarized form, or a combination thereof.

4. The circuit as claimed in claim 2, wherein the circuit is configured to convert first signals for generating $B_1$-fields into second signals for generating B1-fields wherein the phase of the elliptical polarization, linear polarization, or the elliptical polarization and the linear polarization is rotated compared to the $B_1$-fields produced by the first signals.

5. The circuit as claimed in claim 1, wherein the circuit is configured to convert first signals for generating $B_1$-fields into second signals for generating B1-fields comprising a circularly polarized form, elliptically polarized form, linearly polarized form, or a combination thereof.

6. The circuit as claimed in claim 1, wherein the circuit is configured to convert first signals for generating $B_1$-fields into second signals for generating $B_1$-fields wherein the phase of the elliptical polarization, linear polarization, or the elliptical polarization and the linear polarization is rotated compared to the $B_1$-fields produced by the first signals.

7. The circuit as claimed in claim 1, wherein a hybrid coupler of the at least two hybrid couplers is a hybrid coupler of the circuit, a hybrid coupler connected to the circuit, or the hybrid coupler of the circuit and the hybrid coupler connected to the circuit,
   wherein the hybrid coupler of the at least two hybrid couplers is a 90° hybrid, pi/2 hybrid, or the 90° hybrid and the pi/2 hybrid.

8. The circuit as claimed in claim 7, wherein the circuit is configured to generate a circular polarization of a $B_1$-field.

9. The circuit as claimed in claim 1, wherein the at least two hybrid couplers have a same power division, different phases, or the same power division and the different phases,
wherein the at least two hybrid couplers are at least one hybrid coupler of the circuit, at least one hybrid coupler connected upstream of the circuit, or the hybrid coupler of the circuit and the hybrid coupler connected upstream of the circuit.

10. The circuit as claimed in claim 1, wherein signal phases are configured to be adjusted by the at least two phase shifters from a calculation of desired parameters of a desired polarization ellipse.

11. The circuit as claimed in claim 10, wherein the signal phases are configured to be adjusted by virtue of an amplitude ratio of the signals for at least two sub-antennas of the magnetic resonance imaging device initially being adjusted with a first phase shifter of the at least two phase shifters, followed by a phase shift therebetween using a second phase shifter of the at least two phase shifters.

12. The circuit as claimed in claim 1, further comprising a second hybrid coupler arranged in the transmission path.

13. The circuit as claimed in claim 1, wherein the at least one transmission coil is a single body coil, a single local coil, or the single body coil and the single local coil.

14. A magnetic resonance imaging device comprising:
   at least one transmission coil;
   an amplifier;
   a first hybrid coupler arranged in a transmission path between the amplifier and the at least one transmission coil; and
   a circuit comprising:
     at least one second hybrid coupler; and
     at least one phase shifter,
   wherein the circuit is arranged in the transmission path between the first hybrid coupler and the at least one transmission coil, and
   wherein the circuit is configured to emulate adjustment options of a two-channel system.

15. The magnetic resonance imaging device as claimed in claim 14, wherein the transmission coil, a pulse sequence control unit, or the transmission coil and the pulse sequence control unit are configured to generate a circularly polarized magnetic field.

16. A method for actuating a magnetic resonance imaging device, the method comprising:
   providing a circuit of the magnetic resonance imaging device, the circuit comprising at least two hybrid couplers and at least one phase shifter configured to be arranged in a transmission path between an amplifier and at least one transmission coil of the magnetic resonance imaging device;
   receiving, via the circuit, first signals for generating $B_1$-fields;
   actuating the at least one phase shifter;
   converting, via the at least one actuated phase shifter of the circuit, the first signals for generating $B_1$-fields into second signals for generating $B_1$-fields comprising a circularly polarized form, elliptically polarized form, linearly polarized form, or a combination thereof;
   providing the second signals for generating $B_1$-fields to the at least one transmission coil; and
   generating, by the at least one transmission coil, $B_1$-fields based on the second signals for generating $B_1$-fields,
   wherein the circuit is configured to emulate adjustment options of a two-channel system.

* * * * *